United States Patent [19]
Jackson et al.

[11] Patent Number: 5,243,347
[45] Date of Patent: Sep. 7, 1993

[54] MONOTONIC CURRENT/RESISTOR DIGITAL-TO-ANALOG CONVERTER AND METHOD OF OPERATION

[75] Inventors: H. Spence Jackson; Mathew A. Rybicki, both of Austin, Tex.

[73] Assignee: Motorola, Inc., Schaumburg, Ill.

[21] Appl. No.: 951,956

[22] Filed: Sep. 28, 1992

[51] Int. Cl.$^5$ .............................................. H03M 1/66
[52] U.S. Cl. ..................................... 341/144; 341/154
[58] Field of Search ............... 341/144, 118, 113, 145, 341/153, 154

[56] References Cited

U.S. PATENT DOCUMENTS

| | | | |
|---|---|---|---|
| 4,281,319 | 6/1980 | Roberts, Jr. | 340/347 |
| 4,338,592 | 7/1982 | Wilensky | 341/118 |
| 4,410,879 | 10/1983 | Gumm et al. | 340/347 |
| 4,618,847 | 10/1986 | Ida et al. | 340/347 |
| 4,791,406 | 12/1988 | Mehrgardt et al. | 341/144 |
| 4,857,930 | 8/1989 | Lucas | 341/150 |
| 5,138,317 | 8/1992 | Story | 341/144 |

Primary Examiner—A. D. Pellinen
Assistant Examiner—Brian K. Young
Attorney, Agent, or Firm—Robert L. King

[57] ABSTRACT

A digital-to-analog converter (10) performs two distinct conversions (12,59) of most significant bits (MSBs) and least significant bits (LSBs), respectively, of a digital input signal and uses the conversion results to provide an equivalent analog output. A plurality of current sources (34–36) is controlled by a thermometer code equivalent value of the most significant bits to provide a first input current to an output stage (22). A plurality of resistors (60–63) is controlled by a binary to 'one of' equivalent of the least significant bits to provide a second input current to the output stage. The output stage (22) converts a combination of the first and second input currents to the analog output.

17 Claims, 2 Drawing Sheets $N = 0, 1, 2, \ldots$

MONOTONIC CURRENT/RESISTOR DIGITAL-TO-ANALOG CONVERTER AND METHOD OF OPERATION

Cross Reference To Related Application

This application is related to our copending patent application entitled "A Current/Resistor Digital-To-Analog Converter Having Enhanced Integral Linearity And Method Of Operation", Ser. No. 07/951,958, filed of even date herewith and assigned to the assignee hereof.

FIELD OF THE INVENTION

The present invention generally relates to data conversion, and more specifically to digital-to-analog (D/A) converters.

BACKGROUND OF THE INVENTION

There are a variety of known Digital-to-Analog (D/A) converters which convert a signal in digital form to analog form. One particular type of D/A converter is a current D/A converter which utilizes current sources controlled by a digital input signal value which is being converted into an analog equivalent. Current D/A converters utilize resistors to translate a current provided by the current sources into a voltage.

Each current source can be implemented to provide a predetermined value of current. In one form, each current source provides a different amount of current, each value being a binary two multiple. Such converters are commonly said to be binarily weighted. In another form, each current source may be implemented to provide the same amount of current, wherein the D/A converter is called a monotonic converter. Monotonic converters require more current sources than binarily weighted converters to implement the same amount of resolution. However, binarily weighted converters are often not monotonic. Monotonic converters are characterized by the fact that when increasing input signal values are provided to the converter, the output never decreases in value. Binarily weighted converters are not typically monotonic because of error in precisely implementing each current source value. Due to the fact that current source values may vary over a wide range, it is possible that in binarily weighted current source converters that an output value can decrease when an input code is actually increased (i.e. non-montonic). The lack of monotonicity is very undesirable in many control applications in which D/A converters find wide usage. However, for higher resolution requirements, a monotonic converter having $2^N$ equal valued current sources as opposed to N binarily weighted current sources may be prohibitive in size largely due to the size of an associated binary-to-thermometer digital decoder.

SUMMARY OF THE INVENTION

In accordance with the invention, there is provided a monotonic digital-to-analog converter and method for converting a digital input signal having (N+M) bits, where N and M are integers, to an analog output signal. A first means has an input for receiving the N bits of the digital input signal and converts the N bits to a thermometer code equivalent value. A plurality of current sources is provided, each current source providing a predetermined current. A control means is coupled to both the first means and the plurality of current sources, the control means coupling a first portion of the current sources to a first node and coupling a second portion of the current sources to a second node. A second means has an input for receiving the M bits of the digital input signal and provides a control signal resulting from performing a binary to 'one of' conversion of the M bits. A plurality of series connected resistors is connected between a first reference voltage terminal and the first node, the second node being selectively connected to one of the first reference voltage terminal or a portion of the series connected resistors in response to the control signal provided by the second means. An output means having an input is coupled to the first node, the output means providing the analog output signal.

These and other features, and advantages, will be more clearly understood from the following detailed description taken in conjunction with the accompanying drawings. It is important to point out that there may be other embodiments of the present invention which are not specifically illustrated.

Detailed Description of a Preferred Embodiment

Figure 1:
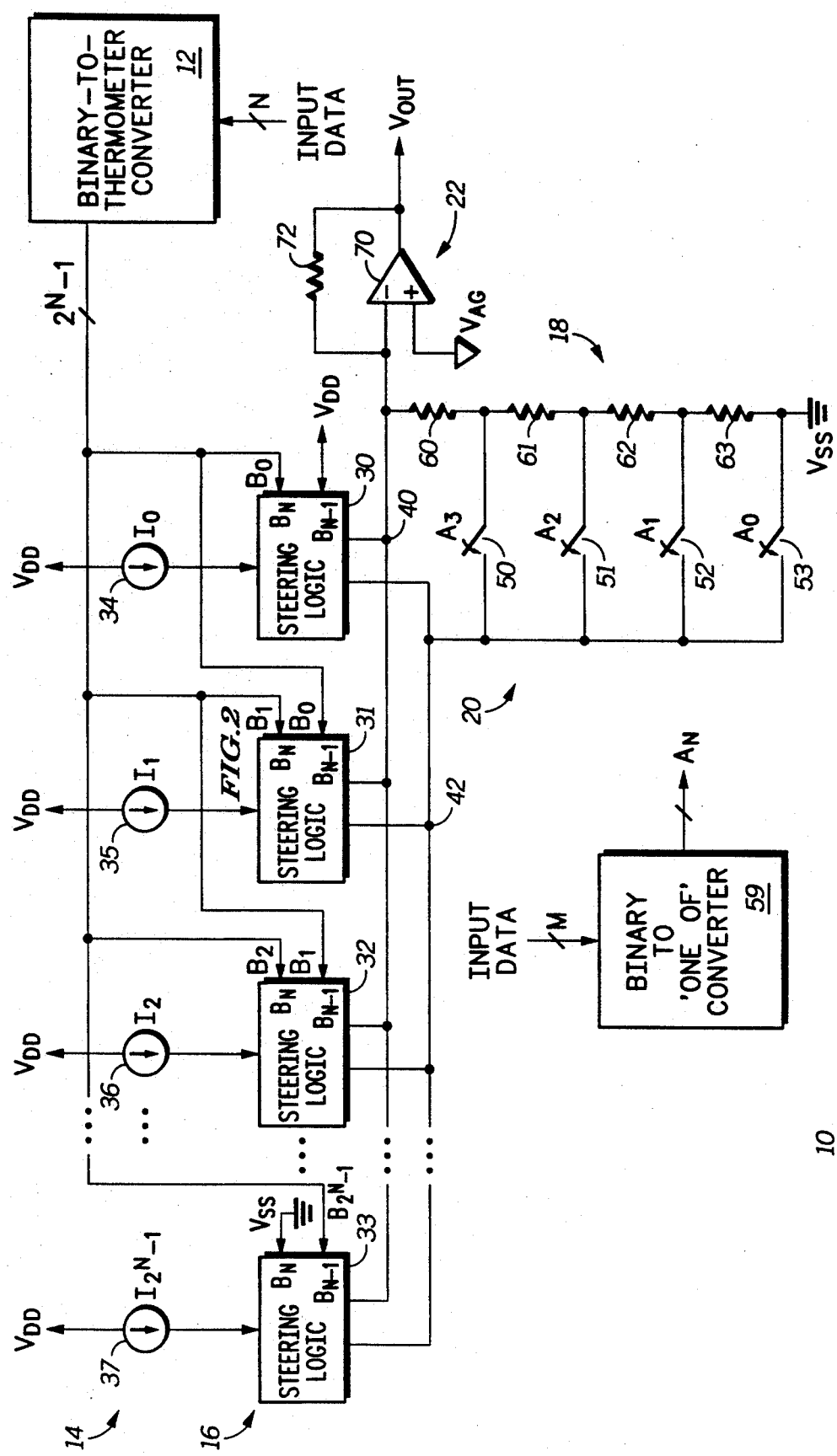
FIG. 1 illustrates in partial schematic diagram form a monotonic digital to analog converter in accordance with the present invention.

Illustrated in FIG. 1 is a monotonic current/resistor digital to analog converter 10. Generally, converter 10 has a binary-to-thermometer converter 12, a current source portion 14, a steering logic portion 16, a resistor ladder portion 18, a control portion 20, and an output portion 22. It should be well understood that converter 10 may be implemented in a variety of semiconductor technology, including metal oxide semiconductor (MOS), bipolar, BiMOS, gallium arsenide, and others.

Binary-to-thermometer converter 12 has a data input for receiving N bits of a digital input signal, where N is an integer. The N bits represent the most significant bits of a digital input signal which is desired to be converted to an equivalent analog value. Any of various known implementations of binary-to-thermometer converter 12 may be used to implement binary-to-thermometer converter 12. Converter 12 has an output connected to a first input, labeled $B_N$, of each of a plurality of steering logic circuits 30, 31, 32 of steering logic portion 16. A first input, labeled $B_N$, of steering logic circuit 33 is connected to a ground reference terminal labeled $V_{SS}$. Binary-to-thermometer converter 12 provides $2^N-1$ output bits. For convenience of illustration, only three output bits, labeled B0, B1 and B2, are illustrated. Other steering logic circuits may be implemented as noted by the intervening dots of FIG. 1. Each of steering logic circuits 30–33 has a second input connected to a predetermined one of the current sources of current source portion 14. Current source portion 14 is illustrated having $2^N$ current sources 34–37 which respectively provide currents I0, I1, I2 thru $I(2^N)-1$. An input of each of current sources 34–37 is connected to a power supply terminal for receiving a power supply voltage labeled $V_{DD}$. An output of current sources 34–37 is respectively connected to the second input of steering logic circuits 30–33. Steering logic circuit 30 also has a third input, labeled $B_{(N-1)}$ for receiving the $V_{DD}$ power supply voltage. Steering logic circuit 31 also has a third $B_{(N-1)}$ input for receiving an input labeled B0 from binary-to-thermometer converter 12. Steering logic circuit 32 has a third $B_{(N-1)}$ input for receiving an input labeled B1 from binary-to-thermometer converter 12. Steering logic circuit 33 has a third $B_{(N-1)}$ input for receiving an input labeled $B(2^N-1)$ from binary-to-thermometer converter 12. A first output of each of steering logic circuits 30-33 is connected to a node 40, and a second output of each of steering logic circuits 30-33 is connected to a node 42.

Control portion 20 has a plurality of switches 50-53 which each has a first terminal connected to node 42. Each of switches 50-53 has a control terminal for respectively receiving control signal bits A0, A1, A2 and A3 which are provided by a binary to 'one of' converter 59. Binary to 'one of' converter 59 has a data input for receiving M bits which represent the least significant bits of the digital input signal which is being converted to analog form. The number M is an integer. Binary to 'one of' converter 59 has an output for providing N control signal bits A, where N is an integer. Each of switches 50-53 has a second terminal.

Resistor ladder portion 18 has a plurality of resistors 60-63. A first terminal of resistor 63 and a second terminal of switch 53 are connected to the $V_{SS}$ ground reference terminal. A second terminal of resistor 63 is connected to a second terminal of switch 52 and to a first terminal of resistor 62. A second terminal of resistor 62 is connected to a second terminal of switch 51 and to a first terminal of resistor 61. A second terminal of resistor 61 is connected to a second terminal of switch 50 and to a first terminal of resistor 60. A second terminal of resistor 60 is connected to node 40.

Output portion 22 has an operational amplifier 70 having a first or negative input connected to node 40. A second or positive input of operational amplifier 70 is connected to an analog ground reference voltage terminal labeled $V_{AG}$. An output of operational amplifier 70 provides an output voltage labeled $V_{out}$. A feedback resistor 72 has a first terminal connected to the negative input of operational amplifier 70 and a second terminal connected to the output of operational amplifier 70.

In operation, digital to analog converter 10 is a monotonic converter which converts an input digital signal having a total of (N+M) bits where N are the most significant bits (MSBs) and M are the least significant bits (LSBs) which are generally divided equally in number. The number of least significant bits chosen determines the number of total switches in control portion 20 which are chosen. If M LSBs are identified, $2^M$ switches are implemented. The binary-to-thermometer converter 12 provides a conventional conversion from binary code to thermometer code. For purposes of facilitating an understanding of converter 12, an example of the conventional binary-to-thermometer code is provided in table one for three input bits.

TABLE ONE

| Binary Input | Thermometer Output |
|---|---|
| 000 | 0000000 |
| 001 | 0000001 |
| 010 | 0000011 |
| 011 | 0000111 |
| 100 | 0001111 |
| 101 | 0011111 |
| 110 | 0111111 |
| 111 | 1111111 |

In the illustrated form, converter 10 has four current sources and the number N is two. In other words, the number of current sources and steering logic circuits which are implemented are determined by the number of MSBs of the digital input signal to be converted. Current sources 34-37 each provide a predetermined current constantly, in the preferred form. In order to provide a linear converter, each of currents I0, I1, I2 and $I(2^N-1)$ is substantially equal. If a nonlinear converter is implemented, currents $I0-I(2^N-1)$ are different in value. The signals $B0-B(2^N-1)$ each represent one of the digital bits provided by binary-to-thermometer converter 12.

Figure 2:
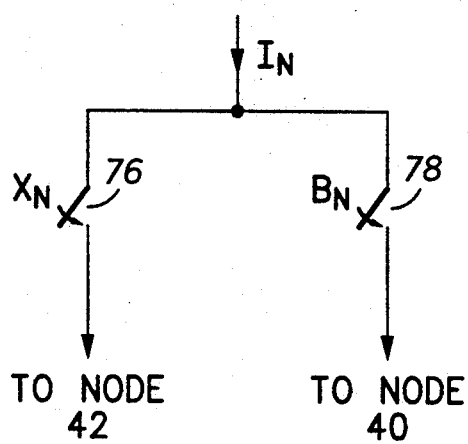
FIG. 2 illustrates in partial schematic diagram form a portion of the steering logic circuitry of the converter of FIG. 1.
Figure 2:
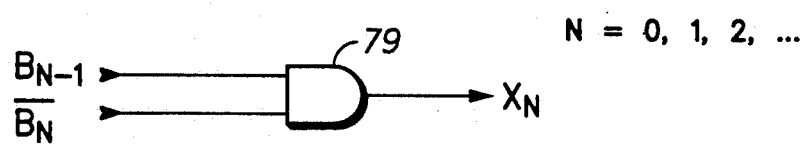

Referring to FIG. 2, an example of steering logic circuits 30-33 is illustrated. For each steering logic circuit a current $I_n$ is input, where n is one of 0, 1, 2, ... $(2^N-1)$. A switch 76 has a first terminal connected to the second terminal of the current source providing current $I_n$. A second terminal of switch 76 is connected to node 42. A switch 78 has a first terminal connected to the first terminal of switch 76 and has a second terminal connected to node 40. Switch 76 is controlled by a signal $X_n$, and switch 78 is controlled by signal $B_n$. For example, if switch 78 is receiving current I1 (i.e. steering logic circuit 31) then switch 78 is controlled by signal B1. The signal Xn is provided by an AND gate 79 which has a first input for receiving signal $B_{n-1}$ and a second input for receiving a logical inverse of signal Bn. For steering logic circuit 30 where n is zero, the signal $B_{n-1}$ is VDD. For steering logic circuit 31 where n is one, the signal $B_{n-1}$ is B0 and the inverse of signal $B_n$ is the inverse of signal B1.

The value of the MSBs of the digital input directly determines how many of the current sources 34-37 are directed to node 40 and operational amplifier 70. Steering logic circuits 30-33 each function to connect a predetermined current source to only one of node 40 or node 42. When the thermometer code output of converter 12 has at least one binary one value, the steering logic circuit which receives a binary one connects an associated current source to node 40. For example, if the values of B0, B1 and B2 are respectively 1, 1 and 0, currents I0 and I1 are connected to node 40 and current I2 is connected to node 42. As can be readily seen from FIG. 1, the current source corresponding to the first thermometer code signal which is not a logic one is connected to a sub-DAC array formed by resistors 60-63. In the example just given, current I2 is directed by steering logic 32 to node 42. Only one of switches 50-53 is ever made conductive at any one point in time. The binary to 'one of' converter 59 is a conventional converter. For purposes of facilitating an understanding of converter 12, an example of the conversion which is implemented is provided in table two for two input bits.

TABLE TWO

| BINARY INPUT | OUTPUT | | | |
|---|---|---|---|---|
| | A3 | A2 | A1 | A0 |
| 00 | 0 | 0 | 0 | 1 |
| 01 | 0 | 0 | 1 | 0 |
| 10 | 0 | 1 | 0 | 0 |
| 11 | 1 | 0 | 0 | 0 |

For the smallest magnitude of input data, when all bits are zero, switch 53 is made conductive and all the current provided to node 42 by steering logic portion 16 is shunted directly to ground. As a result, no additional current to the negative input of operational amplifier 70 is provided by resistor ladder portion 18. If the LSBs have a value which cause one of switches 50-52 to become conductive, a resulting voltage is developed across resistor ladder portion 18 which adds a current into node 40 in addition to the current provided by current source portion 14. Output portion 22 functions to provide an analog output voltage which is inversely proportional in value to the digital signal input value.

In the D/A method taught herein, a conversion of predetermined resolution is actually divided into two separate D/A conversions, each of much less resolution. For example, in a twelve-bit data conversion the conversion process may be divided into two separate six-bit data conversions by converters 12 and 59. By splitting the twelve bits into two six-bit groups, only $2^6$ or one hundred twenty-eight different binary combinations result. To implement the conversion for this resolution in converters 12 and 59, only $2^6$ digital cells are required in each converter, each cell having six inputs. Further, only $(2^6-1)$ current sources and $2^6$ resistors are required. Contrast this with a conventional digital-to-analog converter having twelve bits of resolution. In the conventional monotonic converter, to implement twelve bits of resolution a converter must have $(2^{12})$ digital cells for a binary-to-thermometer conversion, each cell having twelve inputs. As a result, the size of each cell in the conventional monotonic digital-to-analog converter is significantly greater than in the present invention, and the total number of cells is significantly greater in number than with the present invention.

In addition to the significant size reduction as compared with conventional data converters, the digital-to-analog converter taught herein is always guaranteed to be monotonic. The accuracy of this statement can be intuitively verified by determining that the current which is input to operational amplifier 70 can never decrease as the digital input is increased regardless of manufacturing process variations in the values of current sources 34-37 and resistors 60-63. For current sources 34-37, due to the fact that a thermometer code is being used, only additional current is being summed into node 40 for every increase in value of the digital input signal. Therefore, the current summed into node 40 can never decrease for increasing digital input signal values regardless of how poorly matched each of the values of current sources 34-37 are. For resistors 60-63, due to the fact that a ladder structure is used, the current provided by resistor ladder portion 18 into node 40 can also never decrease for an increasing digital input signal value. As a result, converter 10 will always be monotonic and significantly smaller in size as compared with known monotonic converters of the same resolution.

Thus it is apparent that there has been provided, in accordance with the present invention, a digital-to-analog converter that fully meets the needs and advantages set forth previously. Although the invention has been described and illustrated with reference to specific embodiments thereof, it is not intended that the invention be limited to these illustrative embodiments. For example, output stage 22 is optional and not required. If no output stage is connected to node 40, an output voltage is directly developed which may be used as the equivalent analog output signal. Further, other types of output stages may be used in addition to the circuit configuration using operational amplifier 70. Any type of semiconductor device which functions as a switching element may be used for the switches illustrated herein. Those skilled in the art will recognize that modifications and variations can be made without departing from the spirit of the invention. Therefore, it is intended that this invention encompass all such variations and modifications as fall within the scope of the appended claims.

We claim:

1. A monotonic digital-to-analog converter for converting a digital input signal having $(N+M)$ bits, where N and M are integers, to an analog output signal, comprising:
   first conversion means having an input for receiving the N bits of the digital input signal and converting the N bits to a thermometer code equivalent value;
   a plurality of current sources, each current source providing a predetermined current;
   control means coupled to both the first means and the plurality of current sources, the control means coupling a first portion of the current sources to a first node and coupling a second portion of the current sources to a second node in response to the thermometer code equivalent value;
   second conversion means having an input for receiving the M bits of the digital input signal and providing a control signal resulting from performing a binary to 'one of' conversion of the M bits; and
   a plurality of series connected resistors connected between a first reference voltage terminal and the first node, the second node being selectively directly connected to one of: (1) the first reference voltage terminal, or (2) a portion of the series-connected resistors in response to the control signal provided by the second conversion means, the analog output signal being provided at the first node.

2. The monotonic digital-to-analog converter of claim 1 further comprising:
   an output means having an input coupled to the first node, and an output for providing the analog output signal.

3. The monotonic digital-to-analog converter of claim 2 wherein the output means comprise:
   an operational amplifier having a first input coupled to the first node, a second input coupled to a second reference voltage terminal, and an output for providing the analog output signal; and
   a feedback resistor having a first terminal coupled to the first input of the operational amplifier, and having a second terminal coupled to the output of the operational amplifier.

4. The monotonic digital-to-analog converter of claim 1 wherein each of the current sources provides substantially an equal amount of current and each of the resistors is substantially equal in value.

5. The monotonic digital-to-analog converter of claim 1 wherein the control means further comprise:
   a plurality of logic circuits, each logic circuit comprising:
      a first switch having a first terminal coupled to a predetermined one of the current sources, a second terminal coupled to the second node, and a control terminal for receiving a first current steering control signal derived from the thermometer code equivalent value provided by the first conversion means; and
      a second switch having a first terminal coupled to the predetermined one of the current sources, a second terminal coupled to the first node, and a control terminal for receiving a second current steering control signal derived from the thermometer code equivalent value provided by the first conversion means.

6. The monotonic digital-to-analog converter of claim 5 wherein the first current steering control signal is derived for each logic circuit, except a first, by applying a predetermined logic function to two predetermined consecutive bits of the thermometer code equivalent value provided by the first conversion means, a first logic circuit requiring use of only one bit of the thermometer code equivalent value to derive the first current steering control signal for the first logic circuit.

7. A method of converting a digital signal having (N+M) bits, where N and M are integers, to an equivalent analog signal, comprising the steps of:
converting the N bits to a thermometer code equivalent value;
providing a plurality of current sources, each current source providing a predetermined current;
coupling a first portion of the current sources to a first node and coupling a second portion of the current sources to a second node in response to the thermometer code equivalent value;
performing a binary to 'one of' conversion of the M bits to provide a control signal;
providing a plurality of series connected resistors connected between a first reference voltage terminal and the first node;
selectively directly connecting the second node to one of: (1) the first reference voltage terminal, or (2) a portion of the series connected resistors to create a resistor current which is generated by the second portion of the current sources, the connecting being in response to the control signal; and
providing the equivalent analog signal at the first node.

8. The method of claim 7 further comprising the step of:
coupling an output circuit to the first node to buffer the equivalent analog signal.

9. The method of claim 7 wherein the step of providing the plurality of current sources comprises each of the plurality of current sources providing a substantially equal amount of current, and the step of providing a plurality of series-connected resistors comprises each of the plurality of series connected resistors having a substantially identical resistance.

10. The method of claim 7 wherein the step of coupling the first and second portions of the current sources further comprises using a pair of switches for each of the current sources to perform said coupling.

11. The method of claim 10 further comprising the step of:
using a logic gate to control the coupling of the second portion of current sources to the second node, the logic gate being controlled by multiple bits of the thermometer code equivalent value.

12. The method of claim 7 further comprising the step of:
coupling an operational amplifier to the first node to convert current at the first node to a voltage to provide the equivalent analog signal.

13. A digital-to-analog converter, comprising:
a first code converter for converting a group of most significant bits of a digital input signal to a thermometer code conversion signal;
a plurality of current sources, each current source providing a predetermined current;
current steering circuitry for coupling a first portion of the current sources to a first node and coupling a second portion of the current sources to a second node in response to the thermometer code conversion signal;
a second code converter for converting a group of least significant bits of a digital input signal to a binary to 'one of' code conversion signal;
a plurality of series connected resistors connected between a first reference voltage terminal and the first node;
switching circuitry for selectively directly connecting the second node to one of: (1) the first reference voltage terminal, or (2) a portion of the series connected resistors in response to the binary to 'one of' code conversion signal; and
output circuitry coupled to the first node for converting current at the first node to a voltage to provide an output signal which is an analog equivalent of the digital input signal.

14. The digital-to-analog converter of claim 13 wherein the current steering circuitry further comprises a pair of switches for each of the current sources to perform said coupling.

15. The digital-to-analog converter of claim 14 wherein the current steering circuitry further comprises a plurality of logic gates, each logic gate of the plurality of logic gates controlling the coupling of a selected current source of the second portion of current sources to the second node and being controlled by multiple bits of the thermometer code conversion signal.

16. The digital-to-analog converter of claim 13 wherein the current steering circuitry is a plurality of pairs of switches, each pair of switches coupling a predetermined one of the current sources to only one of the first node or the second node, each switch of each pair of switches being controlled by a different control signal.

17. The digital-to-analog converter of claim 13 wherein the output circuitry comprises:
an operational amplifier having a first input coupled to the first node, a second input coupled to a reference voltage terminal, and an output for providing the output signal; and
a resistor having a first terminal coupled to the first input of the operational amplifier, and a second terminal coupled to the output of the operational amplifier.

* * * * *